United States Patent
Simpson

[19]

[11] Patent Number: 6,082,294
[45] Date of Patent: Jul. 4, 2000

[54] METHOD AND APPARATUS FOR DEPOSITING DIAMOND FILM

[75] Inventor: Matthew Simpson, Sudbury, Mass.

[73] Assignee: Saint-Gobain Industrial Ceramics, Inc., Worcester, Mass.

[21] Appl. No.: 08/855,201

[22] Filed: May 12, 1997

Related U.S. Application Data

[60] Provisional application No. 60/019,313, Jun. 7, 1996.

[51] Int. Cl.[7] .............................. H05H 1/00; C23C 16/00
[52] U.S. Cl. ........................................................ 118/723 E
[58] Field of Search ................... 118/723 E; 427/122, 427/569, 577; 156/345; 438/105

[56] References Cited

U.S. PATENT DOCUMENTS

| | | | |
|---|---|---|---|
| 3,736,493 | 5/1973 | Rosenthal et al. | 321/45 R |
| 3,798,457 | 3/1974 | Lowther | 250/532 |
| 3,903,426 | 9/1975 | Lowther | 250/532 |
| 3,919,064 | 11/1975 | Lowther | 204/176 |
| 3,954,586 | 5/1976 | Lowther | 204/176 |
| 4,145,386 | 3/1979 | Rosenthal | 264/22 |
| 4,616,597 | 10/1986 | Kaganowicz | 118/723 |
| 4,770,858 | 9/1988 | Collins | 422/186.18 |
| 4,953,499 | 9/1990 | Anthony et al. | 118/724 |
| 4,970,056 | 11/1990 | Wooten et al | 422/186.07 |
| 5,051,785 | 9/1991 | Beetz, Jr. et al. | 438/105 X |
| 5,104,634 | 4/1992 | Calcote | 423/446 |
| 5,126,164 | 6/1992 | Okazaki et al. | 427/39 |
| 5,182,093 | 1/1993 | Cann | 423/446 |
| 5,194,291 | 3/1993 | D'Aoust et al. | 148/276 |
| 5,340,401 | 8/1994 | Cann | 118/725 |
| 5,403,399 | 4/1995 | Kurihara et al. | 118/723 DC |
| 5,593,539 | 1/1997 | Kubota et al. | 438/710 |
| 5,698,035 | 12/1997 | Matsudo et al. | 118/723 E |

FOREIGN PATENT DOCUMENTS 2-80395 of 1990 Japan .
WO 96/41897 12/1996 WIPO .

OTHER PUBLICATIONS

M. Segers et al., "Thin Film Deposition Using a Dielectric–barrier Discharge", J. Electrochem. Soc., vol. 138, No. 9, Sep. 1991, pp. 2741–2743.
T. Yokoyama et al., "The Improvement of The Atmospheric–Pressure Glow Plasma Method and the Deposition of Organic Films", Rapid Communication, 1989, pp. 374–377.
B. Eliasson et al., "Nonequilibrium Volume Plasma Chemical Processing", IEEE Transactions On Plasma Science, vol. 19, No. 6, Dec. 1991, pp. 1063–1077.
B. Eliasson et al., "Modelling of Dielectric Barrier Discharge Chemistry", Pure & Appl. Chem., vol. 66, No. 6, pp. 1274–2386, 1994.
S. Kanazawa et al., "Stable Glow Plasma At Atmospheric Pressure", Letter To The Editor, 1988, pp. 838–840.
L. Rosenthal, "Corona Discharge Electrode Concepts In Film Surface Treatment", Soc. Plastic Eng. Tech., 1980, pp. 671–674.
M. Noda et al., "Formation of Diamond Films by Intermittent Discharge Plasma Chemical Vapor Deposition", Jpn. J Appl. Phys. vol. 33 (1994), Part 1, No. 7B, Jul. 1994, pp. 4400–4403.

*Primary Examiner*—Thi Dang
*Attorney, Agent, or Firm*—Volker R. Ulbrich

[57] ABSTRACT

An apparatus for depositing diamond film is disclosed, which comprises: a chamber; a reaction zone in the chamber; means for feeding diamond forming gases and an electron source gas into the reaction zone; means for applying an electric field across the reaction zone to accelerate free electrons of the electron source gas and dissociate hydrogen in the diamond forming gases to produce atomic hydrogen; and a deposition surface adjacent the reaction zone, whereby diamond film is deposited on the deposition surface from the diamond forming gases, assisted by the atomic hydrogen.

12 Claims, 9 Drawing Sheets

METHOD AND APPARATUS FOR DEPOSITING DIAMOND FILM

This application claims the benefit of U.S. Provisional application Ser. No. 60/019,313 filing date Jun. 7, 1996.

FIELD OF THE INVENTION

This invention relates to synthesis of diamond and, more particularly, to an improved method and apparatus for producing diamond film by chemical vapor deposition.

BACKGROUND OF THE INVENTION

Diamond has many extraordinary properties, including superlative hardness, thermal conductivity, and optical transmissivity. Synthetic diamond produced by chemical vapor deposition has become commercially viable for practical applications such as wear parts, heat sinks, and optical windows. However, while the cost of producing CVD diamond has decreased in recent years, it is still quite expensive, especially high quality CVD diamond.

There are several components that contribute to the relatively high cost of producing synthetic diamond by chemical vapor deposition. One such cost component is the investment in the capital equipment itself. A second cost component is the cost of reagents. For the most common processes (e.g. arc jet plasma CVD, microwave plasma CVD, and hot filament CVD), which use hydrogen-assisted deposition, hydrogen gas and a hydrocarbon gas are the feedstock gases for the deposition process, and the ratio of hydrogen to hydrocarbon is of the order of 100 to 1. In some processes, hydrogen is consumed in relatively large quantities, so the cost of the hydrogen gas can be a very significant component of the cost of producing CVD synthetic diamond. Another very significant cost component of these processes is the electric power cost of dissociating the hydrogen gas ($H_2$) into the atomic hydrogen that is used at the deposition region to assist diamond growth. This cost component can be considered as the product of two related sub-components; namely, the efficiency with which the electric power dissociates the hydrogen, and the efficiency with which the dissociated hydrogen is brought to the deposition surface. The product of these two efficiencies determines the efficiency with which electric power is converted to dissociated hydrogen that is made available at the location at which it is useful in assisting the diamond deposition process.

Existing diamond deposition techniques tend to be inefficient in their use of hydrogen and/or their use of electric power to obtain dissociated hydrogen at the deposition surface. Arc jet plasma techniques have relatively high fixed costs, produce wasteful heating, and transport and use atomic hydrogen convectively and with relatively poor efficiency. Microwave and planar hot filament CVD systems can both create atomic hydrogen over a relatively large, distributed area. High temperature electrons in microwave plasmas efficiently dissociate hydrogen gas with minimal gas heating, but microwave systems employ costly power supplies, raising fixed costs, and they have poor transport efficiency. Planar hot filaments use inexpensive D.C. power, and transport efficiency is high when the filaments are brought close to the deposition surface. However, hot filament systems have very low values of dissociation efficiency, wasting most of the input energy on sensible gas heating.

It is among the objects of the present invention to provide a technique and apparatus for producing synthetic diamond film with increased efficiency and at lower cost.

SUMMARY OF THE INVENTION

Diamond film deposition can be improved by using a relatively large area source close to the deposition surface and by relying mainly on molecular diffusion to convey atomic hydrogen to the deposition surface. The use of a relatively large area source close to the deposition surface minimizes losses of atomic hydrogen (the most expensive reagent) and promotes a substantially uniform deposition environment at the deposition surface, thereby minimizing homogeneity problems. Use of small path diffusion, rather than convection, also promotes uniformity and minimizes atomic hydrogen loss.

In U.S. patent application Ser. No. 08/607,279 there is disclosed an apparatus and method for depositing diamond film by chemical vapor deposition. In a form of that apparatus, a deposition chamber, comprising an environment of hydrogen and a hydrocarbon gas, is provided. Means are provided for dissociating hydrogen gas of the environment by dielectric barrier discharge to obtain atomic hydrogen. Diamond is deposited on a deposition surface from the hydrocarbon gas, assisted by the atomic hydrogen.

In a disclosed embodiment of U.S. patent application Ser. No. 08/607,279, the means for dissociating hydrogen gas includes: a first electrode; a second electrode spaced from the first electrode; a dielectric barrier between the first and second electrodes; and means for applying a voltage between said first and second electrodes. In this embodiment, the means for dissociating of hydrogen gas is operative to dissociate hydrogen gas at a distance of less than 10 millimeters from the deposition surface.

The operating frequency should be large enough to provide the required power density and low enough so that the plasma has time to recombine and extinguish between cycles. In a disclosed preferred embodiment, the means for applying a voltage includes means for applying an AC voltage in the range 1 KV to 10 KV (and more preferably in the range 1.5 KV to 3.5 KV), having a frequency in the range 10 KHz to 100 KHz (and more preferably in the range 30 KHz to 50 KHz), and further includes a resonant matching circuit for enhancing the efficient transfer of energy. The operating power density of said deposition is preferably at least 5 $W/cm^2$. This power density is much larger than the power density typically used in dielectric barrier discharge for ozone production applications.

In one of the disclosed embodiments the first electrode is a grid electrode and the second electrode is a solid electrode. The grid electrode is disposed between the solid electrode and the deposition surface. In a form of this embodiment, the dielectric barrier is disposed on the second electrode, which is cooled. The dielectric barrier preferably comprises a covering of a polymer film dielectric having a thickness in the range 15 to 150 microns. As the gas gap breaks down, charge accumulates on the dielectric. The field due to accumulated charge cancels the applied field after a few nanoseconds and the microdischarge extinguishes. Immediately another microdischarge appears at another location in the gap. These microdischarges are randomly distributed in time and space. On average, they uniformly cover the electrode surface. When the applied voltage reaches a maximum (dV/dt=0), the displacement current through the dielectric is zero and all discharges extinguish until the polarity reverses and reaches breakdown amplitude. The dielectric limits the duration of any single discharge, and it also spreads the discharges uniformly over the electrode surface.

Atomic hydrogen created between the grid electrode and the other electrode diffuses to the deposition surface to participate in diamond deposition. The cooled dielectric is non-catalytic, deterring recombination on electrode surfaces. Volume recombination in the gas phase is avoided by spacing the electrodes and the substrate only millimeters apart. At the relatively low operating pressure (preferably in the range 10 to 100 torr, and more preferably less than 40 torr), the time for diffusion over this distance is short compared to the time for volume recombination, and a relatively high transport efficiency, for example 0.75, can be anticipated with this technique.

An advantage of the described approach is the efficiency with which the dielectric barrier discharge dissociates hydrogen. Another advantage is that the dissociated hydrogen can readily diffuse to the deposition surface where it performs its function. Efficiency losses resulting from dissociated hydrogen not being brought to the deposition surface, is minimized. Uniformity is also enhanced by the distributed atomic hydrogen generation and the diffusion thereof. Still another advantage is that dissociated hydrogen which recombines during the deposition process can diffuse to where it will again become dissociated by dielectric barrier discharge, thereby achieving recycling of the hydrogen. These factors tend to reduce the volume of hydrogen gas required for the deposition process and to reduce the electrical power needed to produce a given amount of diamond film. Linear cost scaling with size, and the ability to stack deposition modules and use both sides of electrode and/or substrate surfaces, also tends to reduce capital equipment costs.

The technique and apparatus of the present invention for diamond deposition has many of the above described advantages, but does not require a dielectric barrier and produces atomic hydrogen in a different way. In a form of the invention, a method is set forth for depositing diamond film, comprising the following steps: providing an environment comprising a mix of diamond forming gases and an electron source gas; applying an electric field across the environment to accelerate free electrons of the electron source gas, the free electrons dissociating hydrogen in the diamond forming gases to produce atomic hydrogen; and providing a deposition surface in the environment and implementing diamond deposition on the deposition surface from the diamond forming gases, assisted by the atomic hydrogen.

In a preferred embodiment of the invention, the diamond forming gases comprise hydrogen gas and a hydrocarbon gas. The electron source gas can comprise a gas selected from the group consisting of gases of: Li, Na, K, Rb, Cs, Mg, Ca, Sr, Ba, Zn, Cd, Hg, Mn, Yb, Tl, Bi, Te, Pb, hydrides of the foregoing, carbides of the foregoing, and alloys of the foregoing. The electron source gases presently considered more preferred are K (potassium), Na (sodium), and Zn (zinc), with K presently considered most preferred.

An apparatus for depositing diamond film in accordance with an embodiment of the invention comprises: a chamber; a reaction zone in the chamber; means for feeding diamond forming gases and an electron source gas into the reaction zone; means for applying an electric field across the reaction zone to accelerate free electrons of the electron source gas and dissociate hydrogen in the diamond forming gases to produce atomic hydrogen; and a deposition surface adjacent the reaction zone, whereby diamond film is deposited on the deposition surface from the diamond forming gases, assisted by the atomic hydrogen.

In one embodiment of the apparatus, the means for applying an electric field comprises spaced apart conductive plates containing the reaction zone. In a form of this embodiment, the deposition surface is on both of the plates.

In another form of the apparatus, the deposition surface comprises plates containing the reaction zone, and the means for applying the electric field comprises electrodes, separate from the plates, also containing the reaction zone.

Further features and advantages of the invention will become more readily apparent from the following detailed description when taken in conjunction with the accompanying drawings.

DETAILED DESCRIPTION

Figure 1:
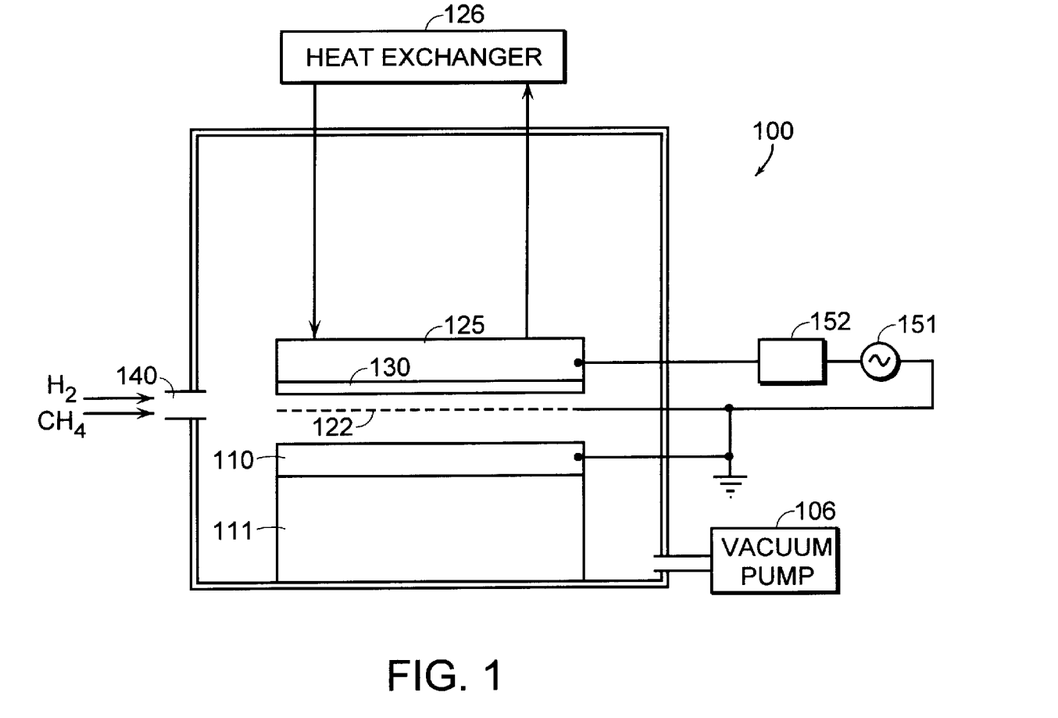
FIGS. 1–16 are diagrams, partially in schematic and partially in block form, describing the apparatus and method disclosed in U.S. patent application Ser. No. 08/607,279.
Figure 2:
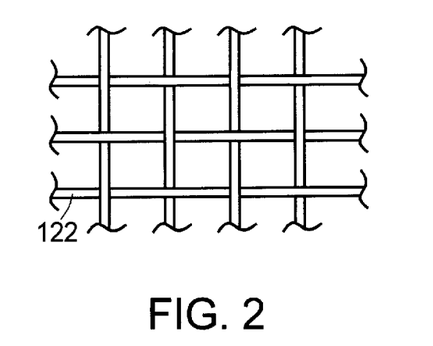

Referring to FIG. 1, there is shown a diagram of a system 100 disclosed in an embodiment of above referenced U.S. patent application Ser. No. 08/607,279. A vacuum chamber 105 is coupled with a vacuum pump 106. A substrate 110 is mounted on a thermally insulating mount or base 111. The base can include a temperature controller. Mounted over and spaced from the substrate 110 is a grid electrode 122 which may be mesh-like screen with a square pattern of conductors, as illustrated in FIG. 2. Mounted over and spaced from the grid electrode 122 is another electrode 125. The face of the electrode 125 that opposes the grid electrode 122 is covered with a dielectric material 130. The substrate 110 and the electrodes 122 and 125 can be of any suitable shape (in this and other embodiments), for example disc-shaped or rectangular. The electrode 125 can also be temperature controlled, for example with a fluid flow heat exchanger, represented at 126, which cools the electrode and the dielectric. Feedstock gases are input at 140. In exemplary embodiments, the feedstock gases are hydrogen and a hydrocarbon gas such as methane. Additional gases, for example nitrogen, argon, mercury vapor and/or oxygen, as well as other hydrocarbons can also be included. A high voltage AC source 151, and a matching network 152, are coupled between the grid electrode 122 and the solid electrode 125.

The AC voltage is preferably in the range 1 KV to 10 KV (and more preferably in the range 1.5 KV to 3.5 KV), and preferably has a frequency in the range 10 KHz to 100 KHz (and more preferably in the range 30 KHz to 50 KHz). The substrate 110 which may, for example, be molybdenum coated with titanium nitrate, or graphite, or silicon, is at the same potential (ground, in this case) as the grid electrode 122. The operating power density of the deposition is preferably at least 5 W/cm$^2$. The dielectric barrier preferably comprises a covering of a polymer film dielectric having a thickness in the range 15 to 150 microns. Teflon or Kapton (trademarks of Dupont deNemours Company) are among the preferred materials. As the gas gap between electrodes breaks down, at a particular location, charge accumulates locally on the dielectric. The field due to accumulated charge locally cancels the applied field after a few nanoseconds and the microdischarge extinguishes. Immediately another microdischarge appears across the gap at another location. These microdischarges are randomly distributed on the electrode surfaces in time and space. On average, they uniformly cover the electrode surface. When the applied voltage reaches a maximum (dV/dt=0), the displacement current through the dielectric is zero and all discharges extinguish until the polarity reverses and reaches breakdown amplitude. The dielectric limits the duration of any single discharge, and it also spreads the discharges uniformly over the electrode surface.

Atomic hydrogen created between the grid electrode and the other electrode diffuses to the deposition surface to participate in diamond deposition. The cooled dielectric is non-catalytic, deterring recombination on electrode surfaces. Volume recombination in the gas phase is avoided by spacing the electrodes and the substrate only millimeters apart. At the relatively low operating pressure (preferably in the range 10 to 100 torr, and more preferably less than 40 torr), the time for diffusion over this distance is short compared to the time for volume recombination, and a relatively high transport efficiency, for example 0.75, can be anticipated. The preferred pressure-distance product is in the range 10 to 100 torr-cm., with a more preferred range of 20 to 40 torr-cm.

The distance between the average location of hydrogen dissociation (about half way between electrodes 122 and 125 in FIG. 1) and the deposition surface will be a few millimeters, and preferably less than 10 millimeters.

The electrodes can be mounted by any suitable means, for example on small dielectric pegs or spacers extending from the base, or by an insulating frame.

Figure 14:
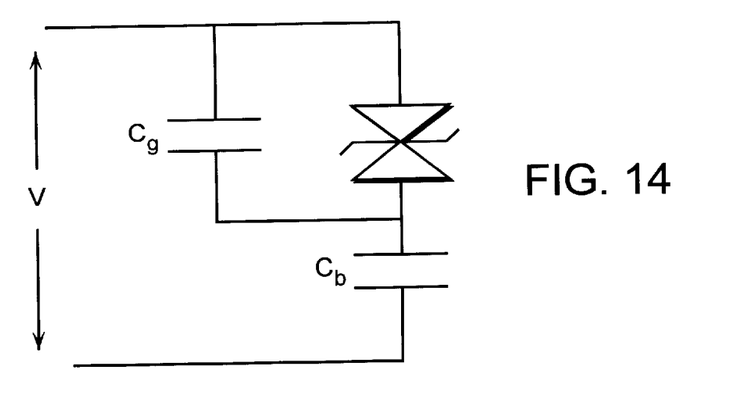
Figure 15:
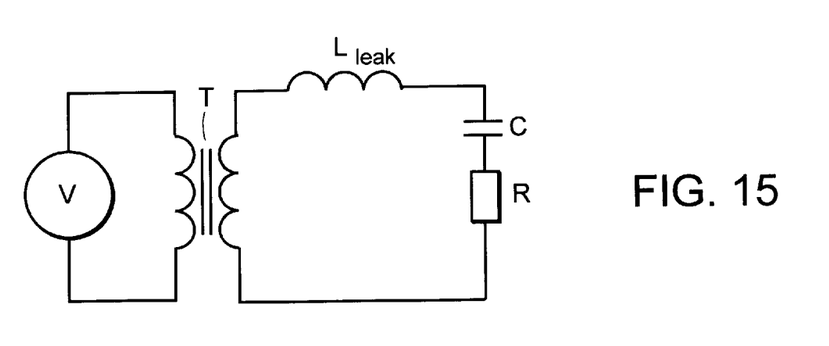
Figure 16:
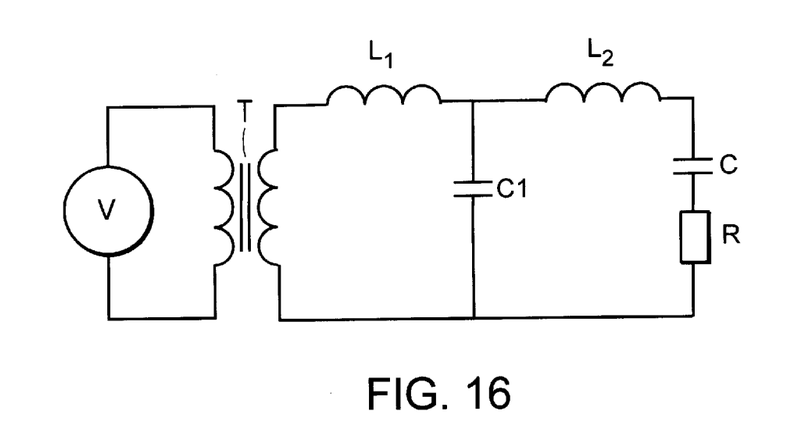

The electrical performance of a dielectric barrier discharge can be modeled by the equivalent circuit of FIG. 14 (see L. Rosenthal, Soc. Plast. Eng. Tech Pap Ann Tech Conf, 1980), where V is the applied voltage, $C_b$ is the barrier capacitance, $C_g$ is the capacitance of the gas gap, and the double anode zener diode represents the breakdown voltage of the gap. The dielectric barrier discharge load is predominantly reactive. It may be approximate by a series capacitor and resistor. For good power transfer a matching network is needed to cancel the load capacitance and to match the supply and load resistance. A typical prior art dielectric barrier discharge supply circuit, shown in FIG. 15, uses the leakage inductance of a step-up transformer to cancel the load capacitance. The circuit includes a transformer T. The typical matching network utilizes the series resonance of the transformer leakage inductance and the load capacitance. While the design of FIG. 15 is economical, it has the drawback of requiring that the applied voltage be much larger than the break down voltage in order to gain power control with voltage. A circuit which gives good power control at applied voltages near Vd is the Tee network of FIG. 16. L1 and C1 resonate at the applied frequency. The Q of this circuit provides enough voltage to break down the gap. L2 is chosen to cancel C once the discharge ignites. The Tee network has the advantage of acting as a low pass filter to remove transients generated in the dielectric barrier discharge.

Power density increases with operating frequency, increased product of dielectric constant ($\epsilon$) and dielectric strength (S), and with breakdown voltage. To achieve power densities that are economically feasible for diamond production, dielectrics are chosen with a high product of $\epsilon S$. The product $\epsilon S$ should preferably be greater than 100 KV/mm. This requirement leads to polymer films of fluorocarbons and polyimides, e.g. Teflon and Kapton, respectively. By minimizing the thickness of these films, the applied voltage is also minimized for a given power density. Thus, thin films lead to simpler electrical design.

The dielectric films must also be kept thin so that they stay cool. The films are heated by the deposition electrode, which operates in the range 400–1100 C. Typical service temperatures for polymer films are 200–350 C. For good dielectric performance the operating temperature should be minimized. For a given heat flux, the temperature drop across the film is proportional to its thickness.

The dielectric barrier is heated by radiation and conduction from the adjacent deposition surface. Substantial heating could come from atomic hydrogen recombination on it surface. Besides providing unwanted heat load, this recombination represents unwanted loss of the primary diamond growth reagent. Polymer films avoid this loss due to their low sticking probability for H recombination. The cooled film should preferably have a sticking probability of less than $10^{-4}$. Polymer films may be attached to the electrode as free standing films or sprayed on as a coating.

Figure 3:
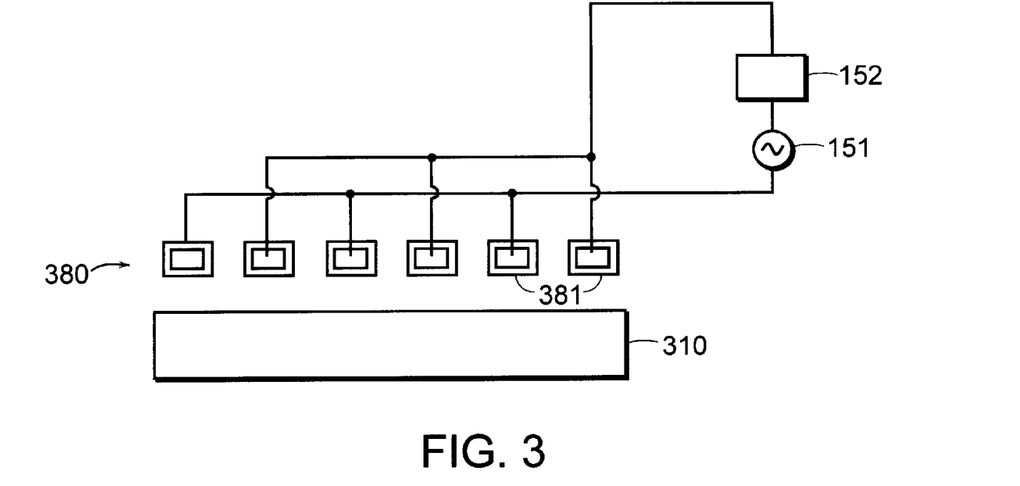
Figure 4:
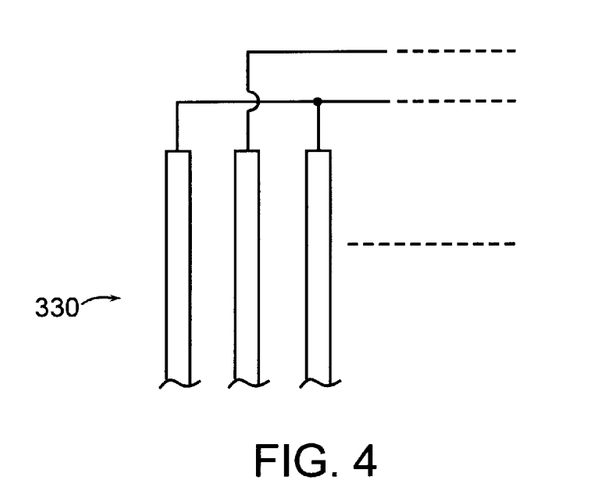
Figure 5:
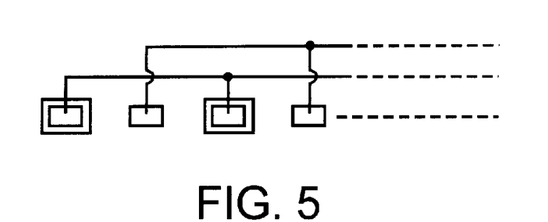

FIG. 3 and subsequent Figures describe further embodiments that can be practiced using equipment and principles of the general type described in conjunction with FIG. 1. In the embodiment of FIG. 3, the solid electrode 125 (of FIG. 1) is not required. FIG. 3 utilizes parallel spaced apart electrodes 380 (also shown in FIG. 3), energized, at alternating polarities, with AC voltage source 151 and matching circuit 152. In FIGS. 3 and 4, the grid electrodes are all covered with a dielectric 381. In the variation of FIG. 5, every other electrode is covered with a dielectric. Cooling of these electrodes and of the dielectrics, can be implemented by circulating fluid through hollow electrode conductors.

Figure 6:
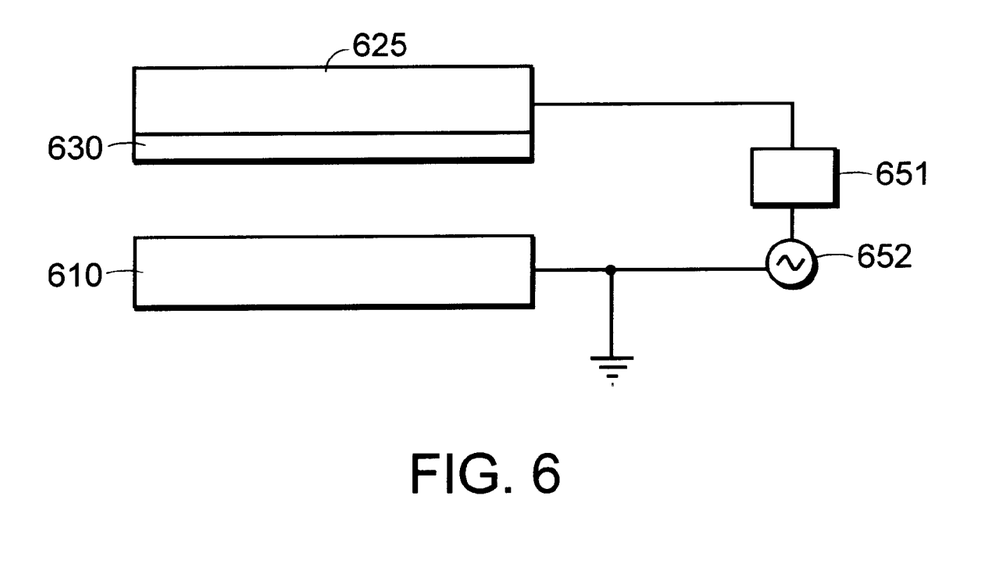

FIG. 6 illustrates another embodiment wherein the electric potential is applied by AC source 651 and matching circuit 652 across spaced apart electrodes 610 and 625, with electrode 625 having dielectric barrier 630. In this case, the diamond deposition is on the electrode 610. It will be understood that if the deposited diamond changes the electrical characteristics during deposition, the AC source and/or matching circuit could be controlled manually or automatically to account therefor.

Figure 7:
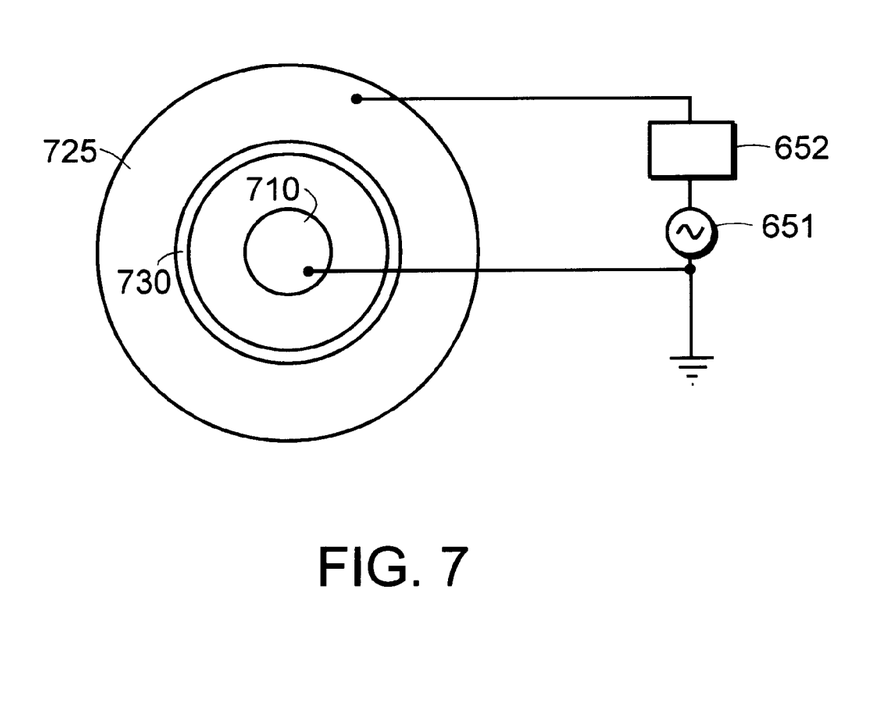

In the embodiment of FIG. 7, electrodes 710 and 725 are energized, as in FIG. 6, by AC source 651 and matching circuit 652. In this case, the electrodes are cylindrically concentric, with a dielectric 730 covering the inner surface of electrode 725. Diamond deposition would be on the surface of the central cylindrical electrode 710. Alternatively, the dielectric could cover the electrode 710, with deposition then being effected on the inner surface of electrode 725. At least the dielectric covered electrode will preferably be cooled by means not shown.

Figure 8:
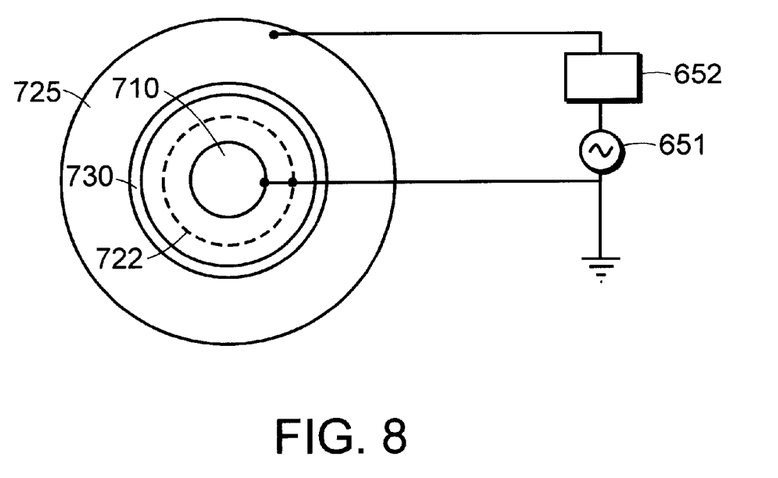

In the arrangement of FIG. 8, a grid electrode 722 (which can, for example, be of the type shown in FIG. 2, but in cylindrical shape) is provided between the solid cylindrical electrodes. In the illustration of the Figure, the dielectric 730 is again shown on the outer electrode 725, and the grid 722 and the inner electrode 710 are at ground potential. Again, however, the dielectric could alternatively be on the inner electrode, with the grid electrode and the outer electrode held at ground potential and the AC voltage applied at the inner electrode, for deposition on the outer electrode.

Figure 9:
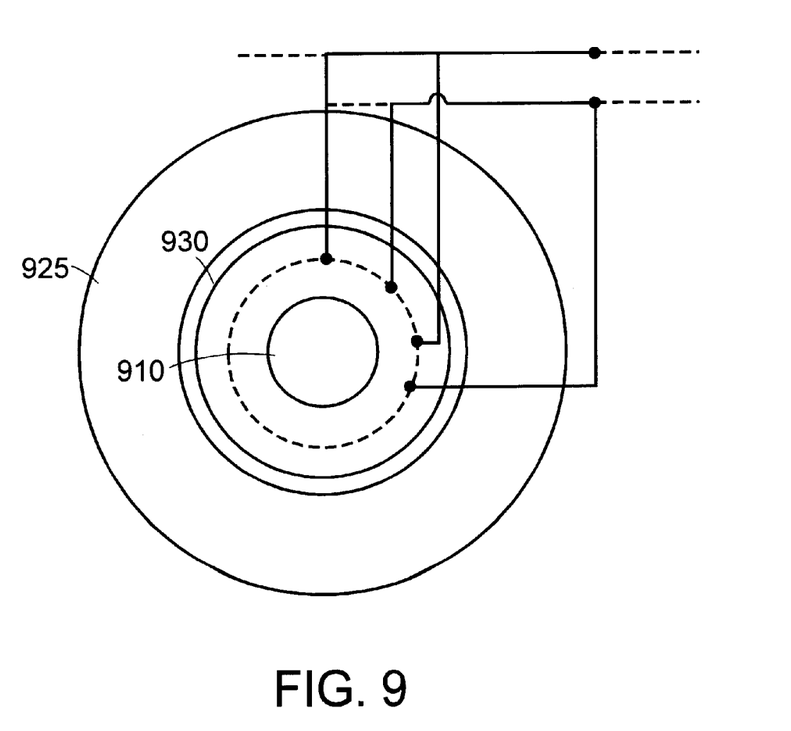

In the configuration of FIG. 9, every other grid is at alternating potential (as in FIGS. 3–5), and diamond deposition can be effected on both the outer surface of substrate 910 and the inner surface of substrate 930. As in FIGS. 3–5, the dielectric can be on every other grid electrode or on every grid electrode, and cooling of the grid can be implemented.

Figure 10:
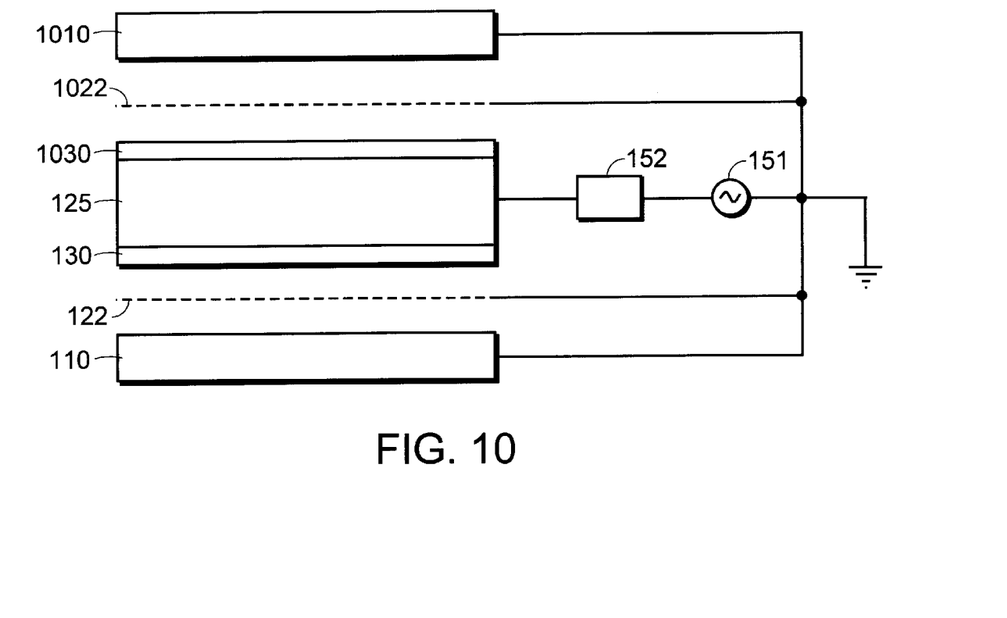

The embodiments of FIGS. 10–13 illustrate how the deposition equipments can be increased in size within a deposition chamber or chambers. The embodiment of FIG. 10 includes substrate 110, grid electrode 122, solid electrode 125, and dielectric covering 130, all of which correspond to like components in FIG. 1. The AC source 151 and matching circuit 152 are also connected as in the FIG. 1 embodiment. In FIG. 10, however, the electrode 125 has a dielectric 1030 covering its top surface, and a further grid electrode 1022 and a further substrate 1010 are also provided, with the grid 1033 and substrate 1010 also being at ground potential. Operation will be as in the FIG. 1 embodiment, but with two (or more, if desired) stacked "subsystems" operating.

Figure 11:
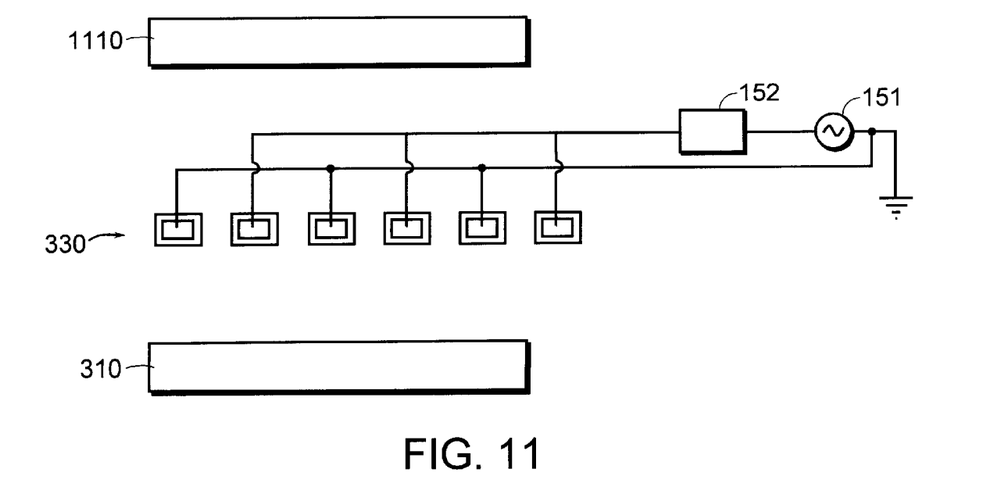

The embodiment of FIG. 11 is seen to be similar to that of FIGS. 3–5, with like reference numerals again representing like components. In this case, in addition to the substrate 310 below, there is also a substrate 1110 above.

Figure 12:
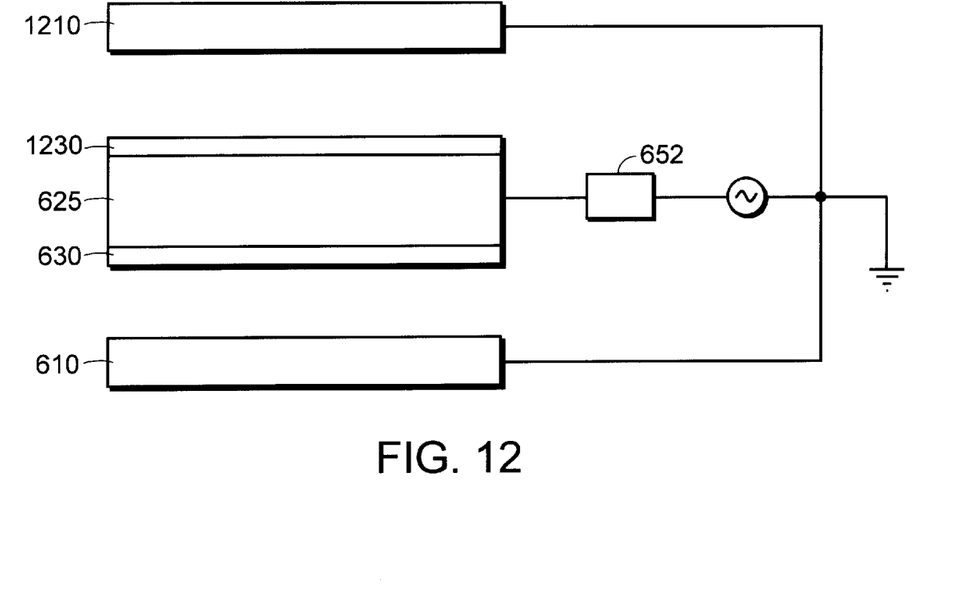
Figure 13:
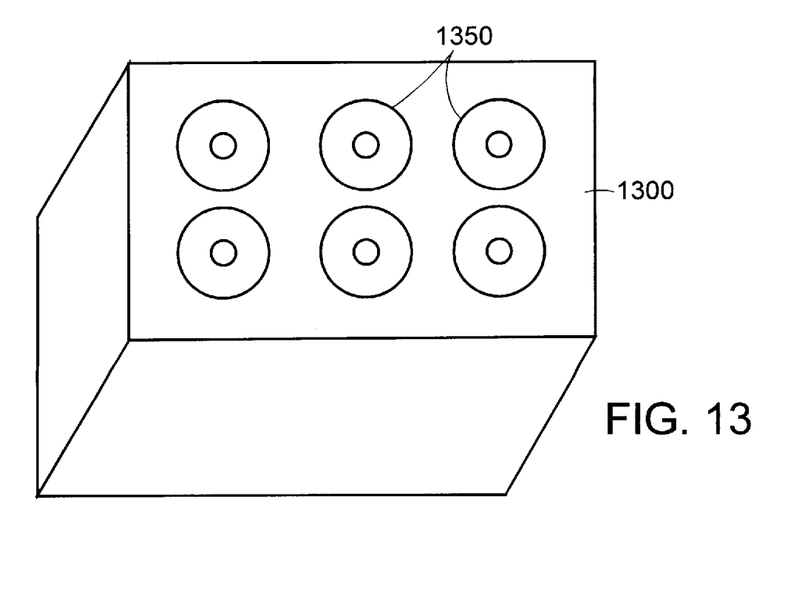

In the embodiment of FIG. 12, like reference numerals again represent like components of FIG. 6. In this case, the electrode 625 includes a top surface covering dielectric 1230, and a further electrode 1210 above, which is coupled in common with electrode 610 and is also used for deposition of diamond. FIG. 13 illustrates a conductive block 1300 which contains several deposition subsystems 1350 that can be like those of FIGS. 7–9. In this illustration, the "outer" electrode will be common to all units, and the central electrodes (or substrates, as the case may be) are isolated therefrom. The grid electrodes of FIGS. 8 and 9 are not shown in this configuration, but can be employed if desired.

Figure 17:
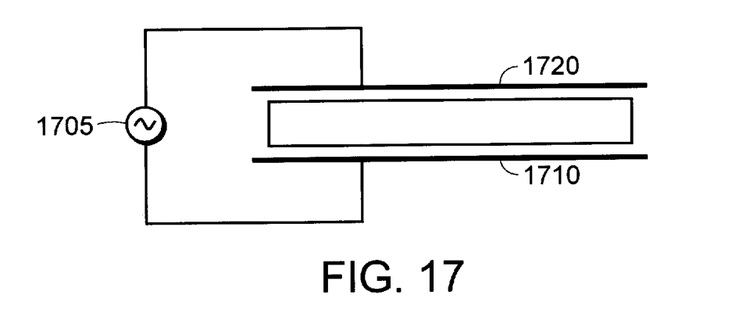
FIG. 17 is a conceptual diagram useful in understanding the invention hereof.

FIG. 17 is a simplified diagram that illustrates operation of an embodiment of the invention. Conductive parallel plates 1710 and 1720 in a vacuum chamber (not shown) have an AC voltage applied thereacross by a source 1705. The reaction region between the plates contains diamond forming gases (hydrogen and a hydrocarbon gas being preferred, although alternatives such as water-alcohol mixes could also be used) and an electron generating gas (that, is a gas from which free electrons are readily obtained). The AC field acts on the free electrons to accelerate them. They lose energy to neutral hydrogen molecules. The field intensity is set high enough to cause dissociation (requiring about 8 eV), but not high enough to cause much ionization of hydrogen (about 13 eV). Because impact ionization is not used to generate charge carriers (as in dielectric barrier discharge), the arc instability does not occur and energy can be distributed more uniformly.

The free electrons are introduced by using a volatile material that loses electrons readily. Potassium (K) is presently considered preferred because of its low cost and low ionization energy (90 kcal/mol).

As an example, consider a plate spacing of 50 mm with a K concentration of $5\times10^{-6}$ of the $H_2$ concentration. [Methane concentration will typically be in the range 0.2 to 1.0 percent of $H_2$ concentration.] The K can be expected to be almost completely ionized by electron impact, so the electron concentration will be similar to the K concentration. At this electron density with an electron temperature of 2 eV maintained by the applied field, the cell conductance will be about 0.017 S/cm². With, for example, a voltage of 25 $V_{rms}$ applied across the gas gap, the power density will be around 10 W/cm². The absence of a dielectric barrier will lower the capital cost somewhat as compared to the dielectric barrier discharge approach, but this will be offset by the need to maintain a controlled partial pressure of K.

Figure 18:
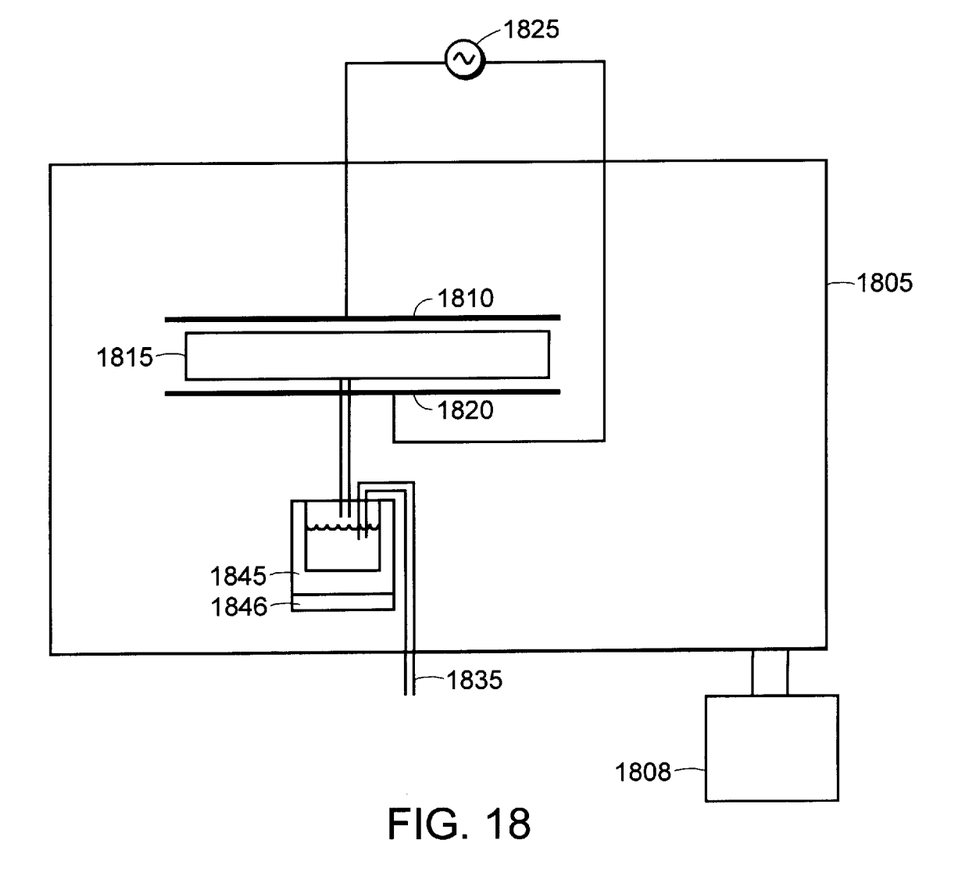
FIG. 18 is schematic diagram of an apparatus in accordance with an embodiment of the invention, and which can be used in practicing an embodiment of the method of the invention.

FIG. 18 illustrates an embodiment of the invention wherein spaced apart parallel conductive plates 1810 and 1820 (mounted by any suitable means, not shown) are located within a chamber 1805 that has pressure maintained by a vacuum pump 1808. The plates are of a material or coated material suitable for deposition of diamond, as previously described. An AC power source is shown at 1825 Hydrogen gas and methane gas are input at feed line 1835 via tank 1845, which contains a potassium source.

Electrons in the gap between the plates 1810, 1820 absorb energy from the field and release it by dissociating hydrogen gas in the region between the plates, thereby generating atomic hydrogen, or by ionizing potassium (K) gas in the space to produce more electrons and thereby balance the loss of electrons due to recombination or diffusion out of the space between the plates. A discharge zone is generally represented at the shaded region 1815. The atomic hydrogen diffuses to the surface of the plates and heals defects in the diamond growing on the plates. It also reacts with hydrocarbon molecules (such as methane, in this example) and produces radicals which add to the diamond surface.

It is desirable to control the total gas pressure, the partial pressures of hydrogen, hydrocarbon species and potassium, and the temperature of the diamond surface on which deposition occurs. Control of the total pressure is achieved by balancing the rate at which gas is supplied with the rate at which the vacuum pump withdraws gas. Control of hydrogen and hydrocarbon species partial pressures is conveniently done with gas flow controllers (not show). Control of the potassium partial pressure is a little more difficult since potassium is a solid, not a gas, at room temperature. A convenient way to introduce a known quantity of potassium is to maintain the potassium at a temperature where the vapor pressure of potassium gas above the material is known and then pass another gas across or through the potassium. In the example of FIG. 18, a source of potassium is provided by potassium hydride powder in a temperature controlled tank 1845, which is heated by a heater represented at 1846. Maintaining its temperature around 400K would give partial pressures of potassium of the order of $10^{-3}$ Pa, which is considered suitable for the reactor. Fine tuning of the reactor performance can be done by adjusting the temperature of the potassium reservoir (and hence the concentration of potassium in the gas) so that the discharge voltage is in a desired range.

It is generally desirable to operate the equipment at as high a power as possible. One limiting factor is the generation of local arcs between the plates which would produce defects in the diamond. To avoid this, it may be beneficial to isolate the front surface of the plates electrically. For example, a coating of a glass-forming oxide and diamond grit could be used, as described in U.S. patent application Ser. No. 08/618,428.

Figure 19:
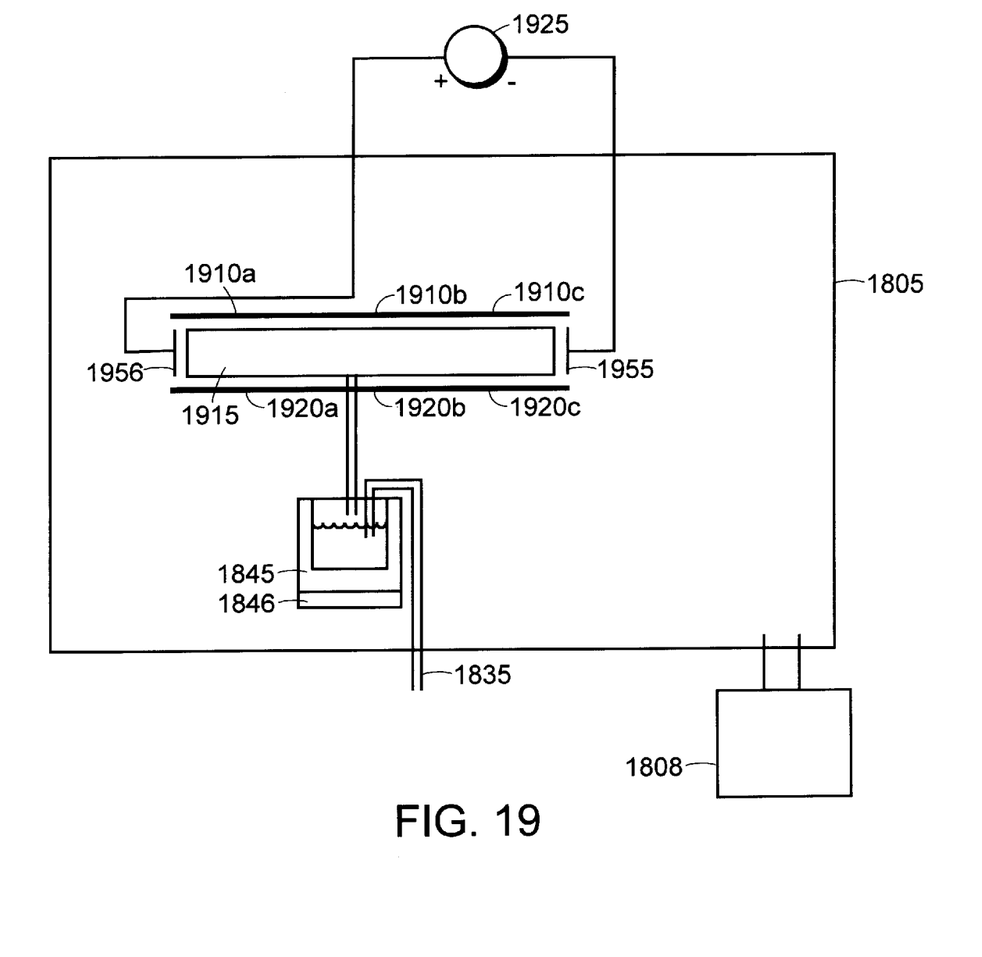
FIG. 19 is schematic diagram of an apparatus in accordance with another embodiment of the invention, and which can be used in practicing an embodiment of the method of the invention.

In the embodiment of FIG. 19, like reference numerals with those of FIG. 18 represent the same or similar elements. In this embodiment, the reactor is configured with the electric field parallel to the deposition surface or surfaces. The reactor functions in generally the same way as before, except that the electrons are emitted from a cathode 1955 and move parallel to the deposition surfaces to an anode 1956 on the opposite end of the reaction zone. In FIG. 19 the power source is shown as a DC source 1925, although an AC source could alternatively be used. In the latter case, the roles of anode and cathode would change every cycle of the power, as occurs in a conventional fluorescent light. The discharge zone is shown at 1915. FIG. 19 shows deposition plates partitioned into segments; that is, plate 1910 into segments, 1910a, 1910b, and 1910c, and plate 1920 into segments 1920a, 1920b, and 1920c. This can be done to increase the allowable operating power. If the plates form a continuous electrical path, then arcs may more easily form between the electrodes and the plates, thereby reducing quality of the diamond produced. Although FIG. 19 shows one cathode and anode, it may be desirable to have several or many of each to reduce the chance of a strong arc developing. In the illustrated embodiments, the deposition surfaces are shown as being plates, but any geometry that does not intrude excessively into the current path would be acceptable. For example, curved configurations could be used, or objects to be coated with diamond film could be stationed at the positions of the plates.

Choice of the electron-generating gas is governed by material and engineering considerations. Metals which are relatively volatile, relatively easily ionized, and which do not readily react with diamond, are preferred. Group 1 (Li, Na, K, Rb, Cs), group 2 (Mg, Ca, Sr, Ba), the volatile transition metals Zn, Cd, Hg, Mn ad the volatile metals Yb, Tl, Bi, Te, Pb are candidates. Compounds of these with low binding energy such as hydrides, carbides or alloys, may also be used. In selecting the free electron generating material, in addition to relative ease of ionization and relative volatility (to minimize undesirable depositing out of the gas phase), considerations of cost and ease of handling and maintaining the material should also be taken into account.

Concentrations of the electron-generating gas need to be high enough to generate a significant number of electrons, the majority of the free electrons in the discharge, but not so high as to interfere with diamond formation. A relative concentration in the range $10^{-10}$–$10^{-1}$ should be appropriate for most materials, with the lower values being favored when very easily ionizable elements are present in situations where a low conductivity is needed and the higher values where higher conductivity is needed. The presently most preferred material is K, and the preferred concentration of K relative to hydrogen is in the range $10^{-8}$ to $10^{-4}$.

Operating pressures are limited by the tendency of hydrogen to recombine in the gas phase. This will limit pressures to below about 150 torr. Growth rates will diminish at low pressures and it is unlikely that appreciable deposition rates will be seen at pressures less than 0.01 torr. These considerations are generally similar to other CVD diamond growth techniques. The presently preferred pressure range herein is 1 to 50 torr. The deposition plate spacings are determined on the high side by the desire not to have too large a reactor nor to waste atomic hydrogen by diffusion to the region outside of the plates. Spacings more than 30 cm are unlikely to be useful. On the low side, if the mean free path of the gas is of the same order of magnitude as the spacings, efficient dissociation of hydrogen will not occur. Spacings of less than 0.5 mm are also quite difficult to maintain for mechanical reasons. The presently preferred range of deposition plate spacings is 5 to 25 mm.

The temperature of the deposition surface needs to be maintained in the diamond forming range of 500–1200 degrees C. This is done by controlling the power to the discharge and the heat extraction from the surface or surfaces on which diamond forms, such as by known heat exchange means (not shown).

It will be understood that the types of stacked and other configurations first shown hereinabove can also be used in conjunction with the free electron excitation approach.

The invention has been described with reference to particular preferred embodiments, but variations within the spirit and scope of the invention will occur to those skilled in the art. For example, it will be understood that supply gases can be fed in separately, and also that several feed positions can be used to promote uniformity.

What is claimed is:

1. Apparatus for depositing diamond film, comprising:
    a chamber;
    a reaction zone in said chamber;
    means for feeding diamond forming gases and an electron source gas into said reaction zone;
    means for applying an electric field across said reaction zone to accelerate free electrons of said electron source gas and dissociate hydrogen in said diamond forming gases to produce atomic hydrogen; and
    a deposition surface adjacent said reaction zone, whereby diamond film is deposited on said deposition surface from said diamond forming gases, assisted by said atomic hydrogen.

2. Apparatus as defined by claim 1, wherein said means for applying an electric field comprises spaced apart conductive plates containing said reaction zone.

3. Apparatus as defined by claim 2, wherein said deposition surface is on at least one of said plates.

4. Apparatus as defined by claim 2, wherein said deposition surface is on both of said plates.

5. Apparatus as defined by claim 1, wherein said deposition surface comprises plates containing said reaction zone, and wherein said means for applying said electric field comprises electrodes, separate from said plates, also containing said reaction zone.

6. Apparatus as defined by claim 1, wherein said diamond forming gases comprise hydrogen gas and a hydrocarbon gas.

7. Apparatus as defined by claim 1, wherein said electron source gas comprises a gas selected from the group consisting of gases of: Li, Na, K, Rb, Cs, Mg, Ca, Sr, Ba, Zn, Cd, Hg, Mn, Yb, Tl, Bi, Te, Pb, hydrides of the foregoing, carbides of the foregoing, and alloys of the foregoing.

8. Apparatus as defined by claim 6, wherein said electron source gas comprises a gas selected from the group consisting of K, Na, and Zn.

9. Apparatus as defined by claim 6, wherein said hydrogen gas in said environment is at a pressure in the range 1 torr to 50 torr.

10. Apparatus as defined by claim 9, wherein said electron source gas is K, and wherein the concentration of K relative to hydrogen is in the range $10^{-8}$ to $10^{-4}$.

11. Apparatus as defined by claim 1, wherein said means for feeding diamond forming gases and an electron source gas into said reaction zone comprises means for feeding a vapor of potassium to said reaction zone.

12. Apparatus as defined by claim 11, wherein said means for feeding a vapor of potassium includes means for passing a gas through a heated source of potassium.

* * * * *